US011187722B2

(12) United States Patent
Teranishi et al.

(10) Patent No.: US 11,187,722 B2
(45) Date of Patent: Nov. 30, 2021

(54) PROBE PIN AND ELECTRONIC DEVICE USING THE SAME

(71) Applicant: OMRON Corporation, Kyoto (JP)

(72) Inventors: Hirotada Teranishi, Osaka (JP); Takahiro Sakai, Shiga (JP); Makoto Kondo, Shiga (JP); Naoyuki Kimura, Okayama (JP)

(73) Assignee: Omron Corporation, Kyoto (JP)

( * ) Notice: Subject to any disclaimer, the term of this patent is extended or adjusted under 35 U.S.C. 154(b) by 559 days.

(21) Appl. No.: 16/093,497

(22) PCT Filed: Feb. 27, 2017

(86) PCT No.: PCT/JP2017/007497
§ 371 (c)(1),
(2) Date: Oct. 12, 2018

(87) PCT Pub. No.: WO2017/179320
PCT Pub. Date: Oct. 19, 2017

(65) Prior Publication Data
US 2021/0215740 A1 Jul. 15, 2021

(30) Foreign Application Priority Data

Apr. 15, 2016 (JP) .............................. JP2016-082188

(51) Int. Cl.
*G01R 1/067* (2006.01)
*H01R 13/24* (2006.01)
*H01L 21/00* (2006.01)

(52) U.S. Cl.
CPC ..... *G01R 1/06722* (2013.01); *G01R 1/06738* (2013.01); *H01R 13/2421* (2013.01)

(58) Field of Classification Search
CPC ....... G01R 1/00; H01L 21/00; H01L 2221/00; H01R 3/00; H01R 2101/00
See application file for complete search history.

(56) References Cited

U.S. PATENT DOCUMENTS

| 4,935,696 A * | 6/1990 | DiPerna | G01R 1/07378 324/72.5 |
| 2004/0051546 A1* | 3/2004 | Thiessen | G01R 3/00 324/755.11 |

(Continued)

FOREIGN PATENT DOCUMENTS

| JP | H10-221367 A | 8/1998 |
| JP | 200030827 A | 1/2000 |

(Continued)

OTHER PUBLICATIONS

Extended European Search Report issued in the counterpart European Patent Application No. 17782138.6, dated Nov. 19, 2019 (10 pages).

(Continued)

*Primary Examiner* — Jermele M Hollington
*Assistant Examiner* — Temilade S Rhodes-Vivour
(74) *Attorney, Agent, or Firm* — Osha Bergman Watanabe & Burton LLP

(57) ABSTRACT

A probe pin includes a coil spring extending and contracting along a center line, a first contact disposed on one side of the center line and having a rectangular cross section, and a second contact disposed on the other side of the center line and having a rectangular cross section. The first contact and the second contact are supported so as to be reciprocable via the spring coil and are electrically connected to each other. In particular, a contact surface of at least one of the first contact and the second contact is an inclined surface inclined so as to descend along a thickness direction.

19 Claims, 17 Drawing Sheets

(56) References Cited

U.S. PATENT DOCUMENTS

| | | | |
|---|---|---|---|
| 2006/0073710 A1 | 4/2006 | Hwang | |
| 2010/0231251 A1 | 9/2010 | Nelson et al. | |
| 2011/0248736 A1* | 10/2011 | Kato | H01R 13/2421 |
| | | | 324/755.05 |
| 2012/0122355 A1* | 5/2012 | Hemmi | G01R 1/06722 |
| | | | 439/816 |
| 2013/0002285 A1 | 1/2013 | Nelson et al. | |
| 2013/0257467 A1 | 10/2013 | Tomioka | |
| 2016/0072202 A1 | 3/2016 | Hemmi et al. | |
| 2016/0274199 A1* | 9/2016 | Gopman, IV | G01R 33/16 |
| 2017/0102409 A1* | 4/2017 | Sarhad | G01R 31/303 |
| 2017/0138985 A1 | 5/2017 | Teranishi et al. | |

FOREIGN PATENT DOCUMENTS

| | | |
|---|---|---|
| JP | 2007139567 A | 6/2007 |
| JP | 2008-516398 A | 5/2008 |
| JP | 201038837 A | 2/2010 |
| JP | 2012-520461 A | 9/2012 |
| JP | 2012181096 A | 9/2012 |
| JP | 2015-040734 A | 3/2015 |
| JP | 2015-076325 A | 4/2015 |
| JP | 2016038207 A | 3/2016 |
| KR | 20120024541 A | 3/2012 |
| KR | 20120104878 A | 9/2012 |
| KR | 20150138289 A | 12/2015 |
| WO | 2011071082 A1 | 6/2011 |
| WO | 2015194384 A1 | 12/2015 |

OTHER PUBLICATIONS

Masson, A.; "11 Les Pointes De Test Influencent Le Résultat Des Mesures"; Mesures Regulation Automatisme, CFE.; Paris, France; Mar. 1, 1997 (4 pages).

Office Action issued in Japanese Application No. 2018-511919; dated Feb. 4, 2020 (12 pages).

International Search Report issued in PCT/JP2017/007497 dated May 23, 2017 (2 pages).

Written Opinion of the International Searching Authority issued in PCT/JP2017/007497 dated May 23, 2017 (4 pages).

Office Action issued in Korean Application No. 2018-7029236; dated Sep. 16, 2019 (14 pages).

* cited by examiner

PROBE PIN AND ELECTRONIC DEVICE USING THE SAME

TECHNICAL FIELD

The present invention relates to a probe pin, and more particularly to a probe pin for inspecting a ball grid array (BGA) type semiconductor IC in which a large number of ball solders are arranged on the bottom surface.

BACKGROUND ART

As a probe pin for inspecting a BGA type semiconductor IC, there is a contact for an electronic device disclosed in Patent Document 1, for example.

That is, as illustrated in FIGS. 26(A) to 26(C), there is a probe pin for inspecting the semiconductor IC 101 by coming into contact with a ball-like lead 102 provided on the bottom surface of the semiconductor IC 101. As illustrated in FIGS. 27 and 28, a contact part 111, cut out into a substantially V shape, in an upper contact pin 110 comes into contact with the ball-like lead 102 for electrical connection, so that the probe pin can inspect the semiconductor IC 101.

PRIOR ART DOCUMENT

Patent Document

Patent Document 1: JP 2008-516398 A

SUMMARY OF THE INVENTION

Problems to be Solved by the Invention

However, in the upper contact pin 110, the lead 102 merely comes into contact with the contact surface of the substantially V shaped contact part 111.

As a result, an oxide film formed on the surface of the lead 102 cannot be reliably scraped off, causing contact failure to easily occur and variation in inspection accuracy to easily occur, which has been problematic.

In view of the above problem, it is an object of the present invention to provide a probe pin in which contact failure hardly occurs and has uniform inspection accuracy.

Means for Solving the Problem

For solving the above problem, a probe pin according to one aspect of the present invention is a probe pin including: an elastic part extending and contracting along a center line; a first contact disposed on one side of the center line and having a rectangular cross section; and a second contact disposed on the other side of the center line and having a rectangular cross section, the probe pin being where the first contact and the second contact are supported so as to be reciprocable via the elastic part and are electrically connected to each other, and it is configured such that a contact surface of at least one of the first contact and the second contact is an inclined surface inclined so as to descend along a thickness direction.

Effect of the Invention

According to the above aspect of the present invention, when a ball solder comes into contact with the inclined contact surface of the contact, the ball solder slides on the contact surface, so that the oxide film of the ball solder is scraped off. Therefore, contact failure hardly occurs, and probe pins having no variation in inspection accuracy can be obtained.

MODES FOR CARRYING OUT THE INVENTION

Figure 1:
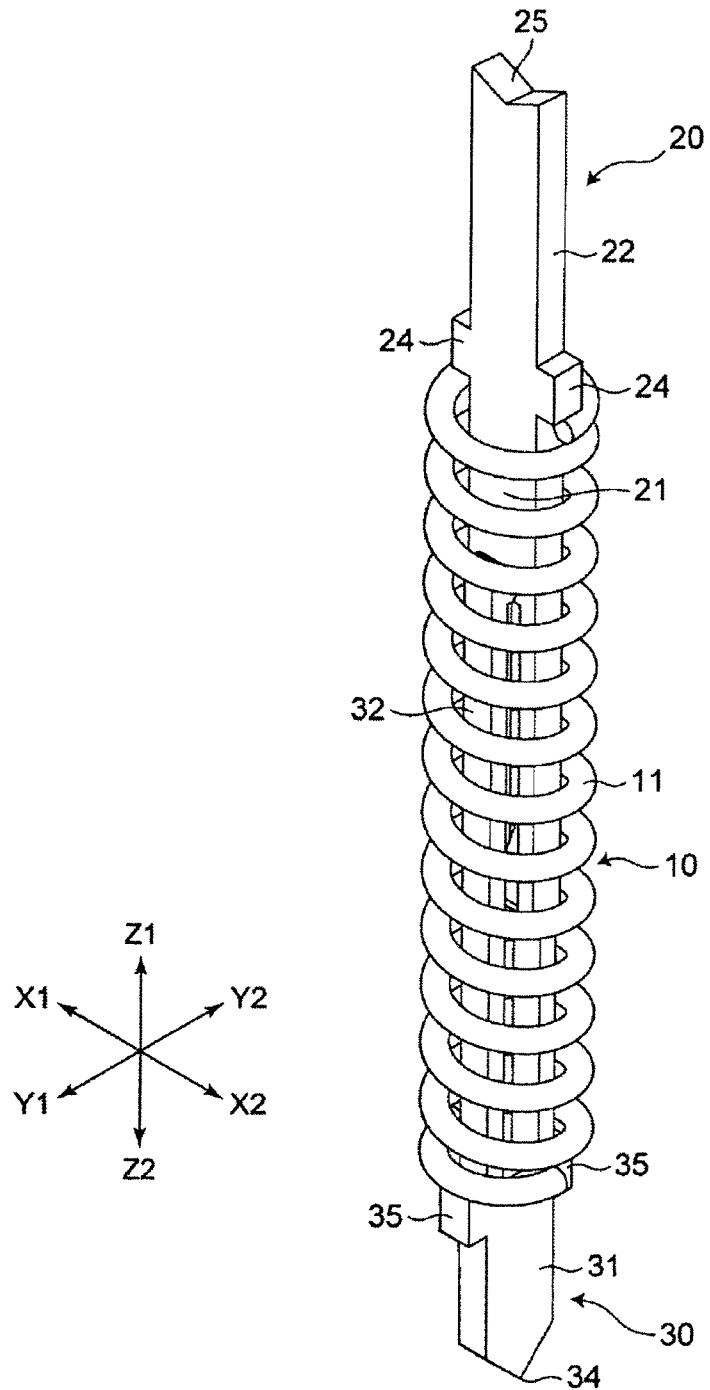
FIG. 1 is a perspective view illustrating a probe pin according to a first embodiment of the present invention.

Before continuing with the description of the present invention, the same reference numerals are provided to the same parts in the accompanying drawings.

Hereinafter, a first embodiment of the present invention will be described in detail with reference to the drawings.

A probe pin according to an embodiment of the present invention will be described with reference to the attached drawings of FIGS. 1 to 24.

In the following description, in order to describe the configuration shown in the drawing, terms indicating directions such as "upper", "lower", "left", and "right", in addition to "X direction", "Y direction", and "Z direction", and other terms including those terms will be used. The purpose of using these terms is to facilitate understanding of the embodiments through the drawings. Accordingly, those terms do not necessarily indicate directions used at the time of actually using the embodiments of the present invention. A technical scope of the invention recited in the claims shall not be restrictively interpreted by using those terms.

As illustrated in FIGS. 1 to 6, the probe pin 10 according to the first embodiment includes a coil spring 11 as an example of an elastic part, a first plunger 20, and a second plunger 30. Each of the first and second plungers 20, 30 has electrical conductivity, and is formed by, for example, an electroforming method. The coil spring 11 expands and contracts along a center line. A first contact 25 is disposed on one side on the center line and has a rectangular cross section. A second contact 34 is disposed on the other side on the center line and has a rectangular cross section. The first contact 25 and the second contact 34 are supported so as to be reciprocable via the coil spring 11 and are electrically connected to each other as a probe pin 10.

The coil spring 11 is formed of carbon steel or stainless steel, for example. As illustrated in FIGS. 2 and 3(A) to 3(C), an inner diameter of the coil spring 11 is slightly larger than the width dimension (X1-X2 direction) of a clamped part 21 of the first plunger 20, which will be described later. The inner diameter of the coil spring 11 is slightly larger than the width dimension (Y1-Y2 direction) of each of the first and second elastic pieces 32, 33 provided on the second plunger 30, which will be described later. Further, an outer diameter of the coil spring 11 is mostly the same as the width dimension (X1-X2 direction) of each of the retaining parts 24, 24 of the first plunger 20. The outer diameter of the coil spring 11 is mostly the same as the width dimension (Y1-Y2 direction) of each of the retaining parts 35, 35 of the second plunger 30.

Figure 5:
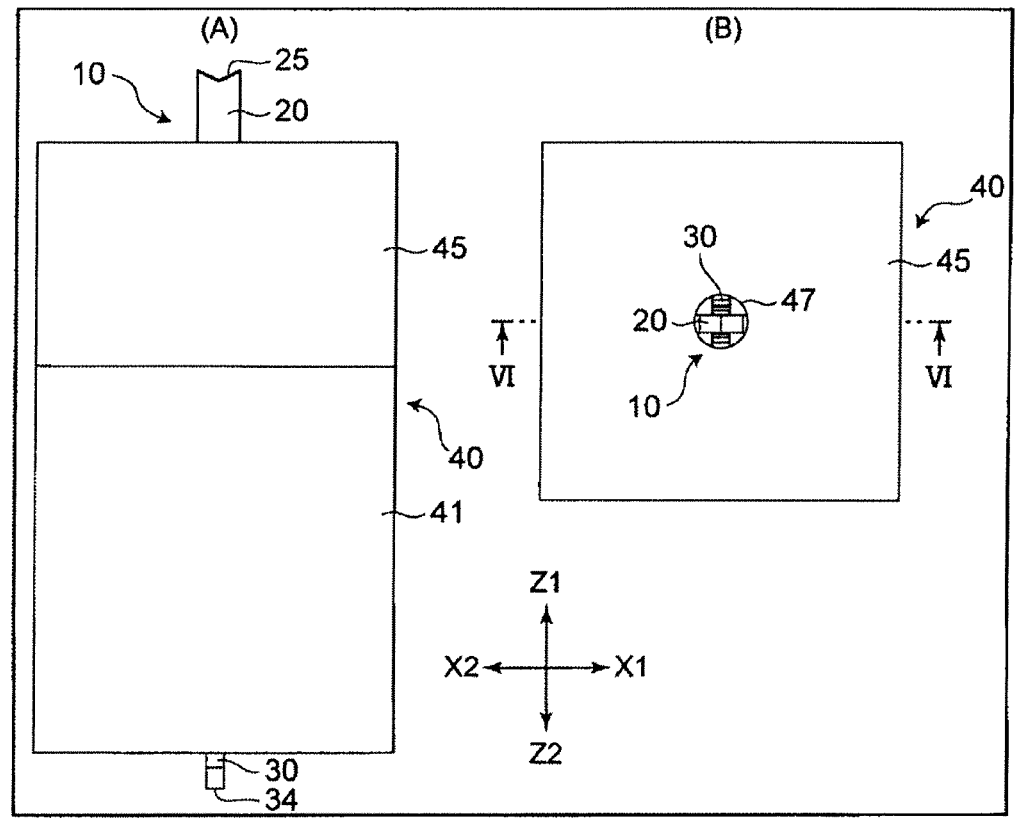
FIGS. 5(A) and 5(B) are a rear view and a plan view illustrating an inspection unit which is an example of an electronic device according to the present invention.

Note that the length dimension (Z1-Z2 direction) of the coil spring 11 may be adjusted such that the coil spring 11 is constantly compressed as required in the state illustrated in FIGS. 5, 6(A) and 6(B), or may be adjusted such that the coil spring 11 comes into a free state without compression.

As illustrated in FIGS. 2 and 3(A) to 3(C), the first plunger 20 has a flat plate shape extending along the Z1-Z2 direction and is formed to have mostly the same thickness dimension. The first plunger 20 is made up of the clamped part 21 and a first contact part 22 continuous from the clamped part 21 in the Z1 direction. In the first plunger 20, the surface along the X1-X2 direction is a main surface, and the surface along the Y1-Y2 direction orthogonal to the main surface is a side surface.

The clamped part 21 has a rectangular guide groove 23 penetrating the main surface. The guide groove 23 is formed along the Z1 direction from the lower end edge of the clamped part 21. The width dimension (X1-X2 direction) of the guide groove 23 is larger than a thickness dimension (X1-X2 direction) of the second plunger 30.

Figure 2:
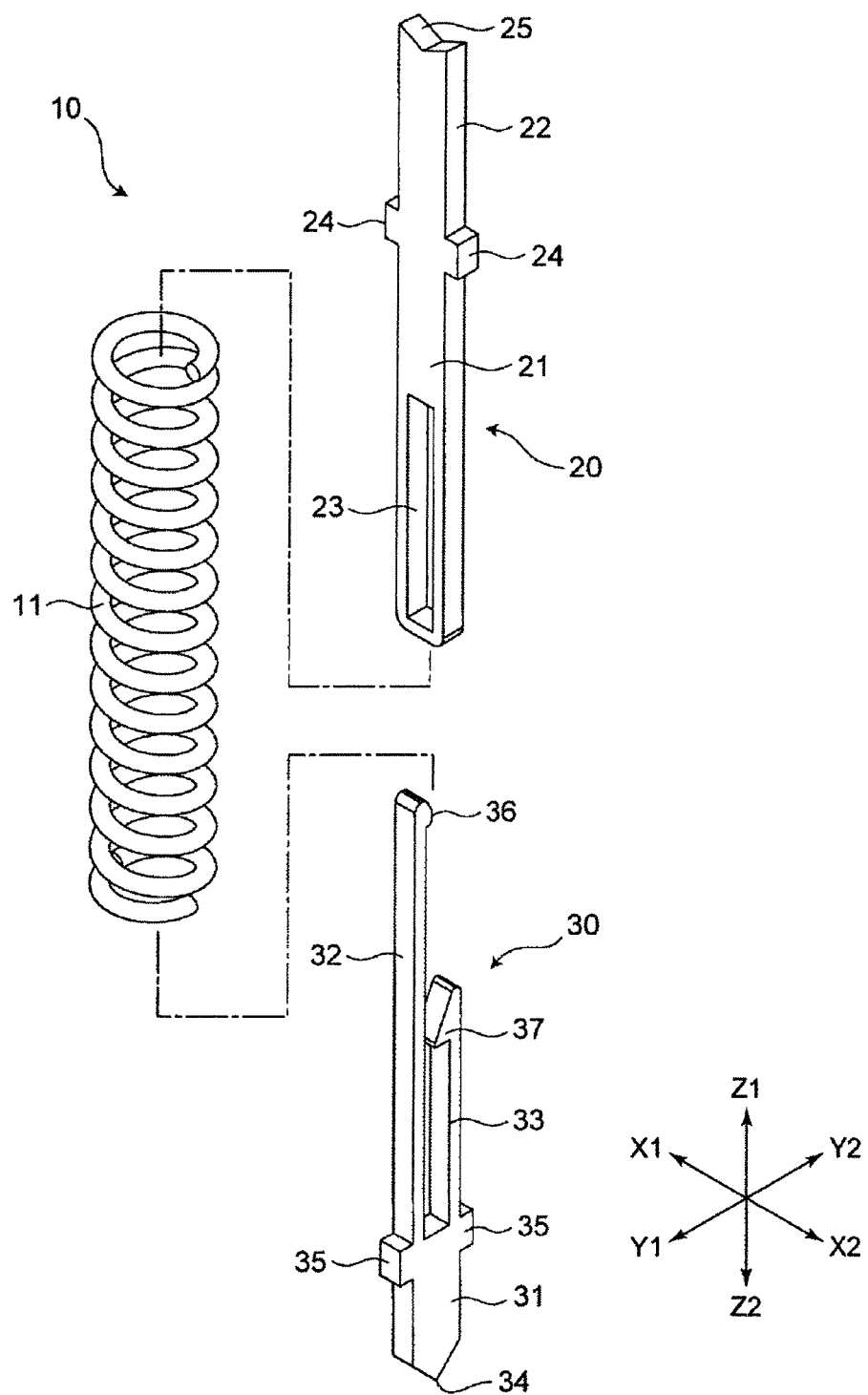
FIG. 2 is an exploded perspective view of the probe pin illustrated in FIG. 1.
Figure 3:
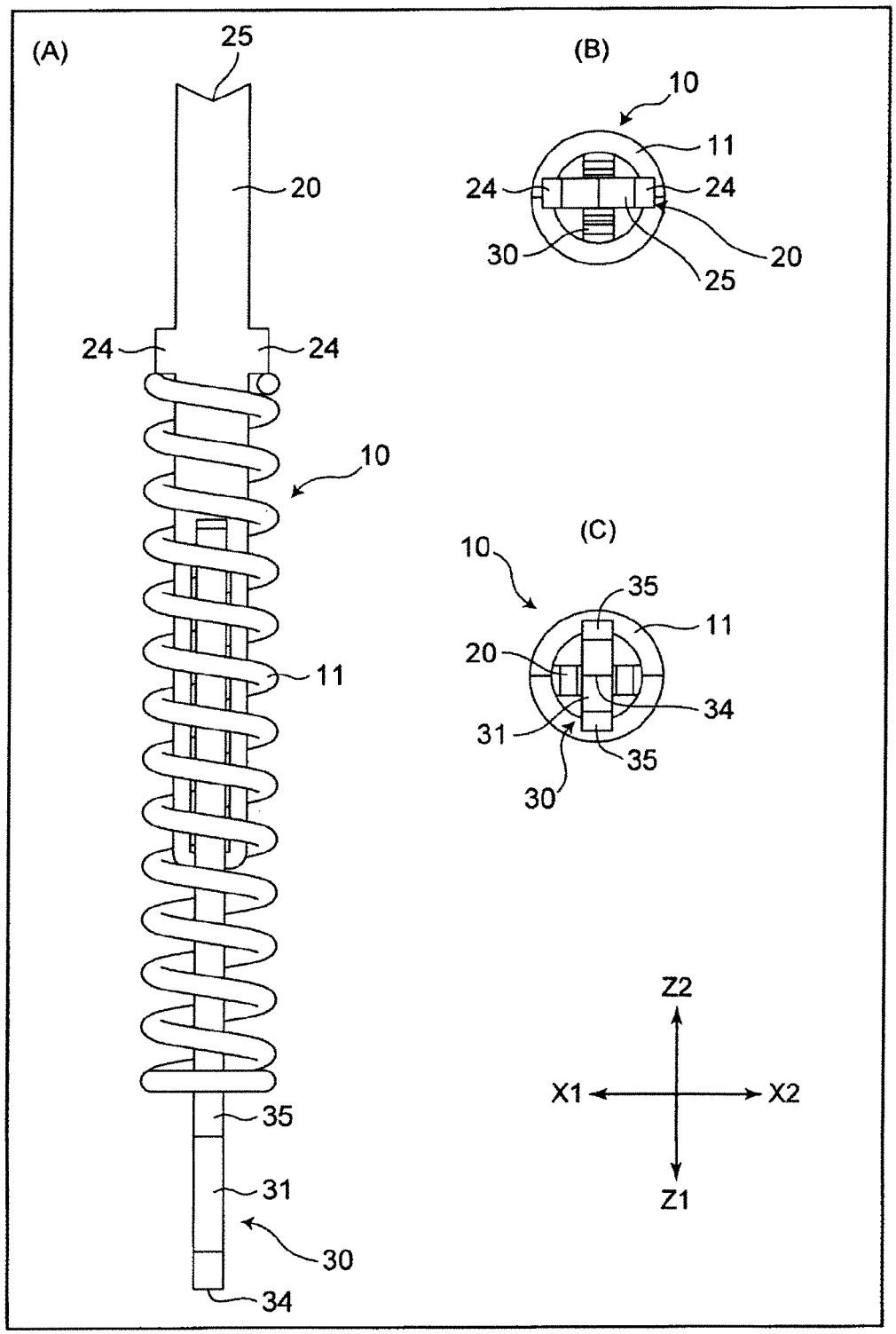
FIGS. 3(A), 3(B) and 3(C) are a front view, a plan view, and a bottom view of the probe pin illustrated in FIG. 1.
Figure 4:
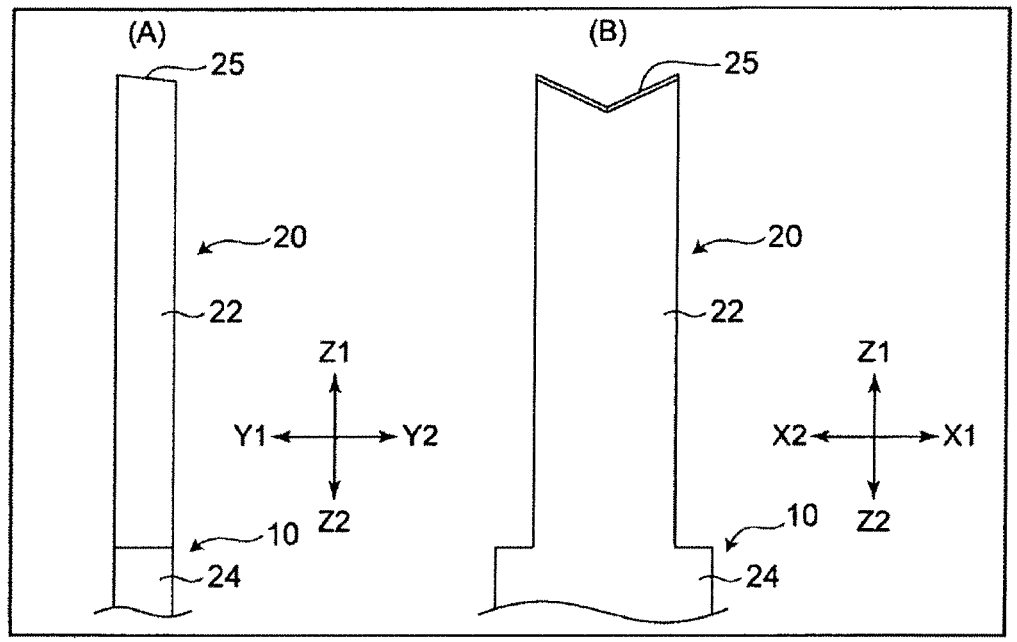
FIGS. 4(A) and 4(B) are a partial enlarged right side view and a partial enlarged rear view of the probe pin illustrated in FIG. 1.
Figure 6:
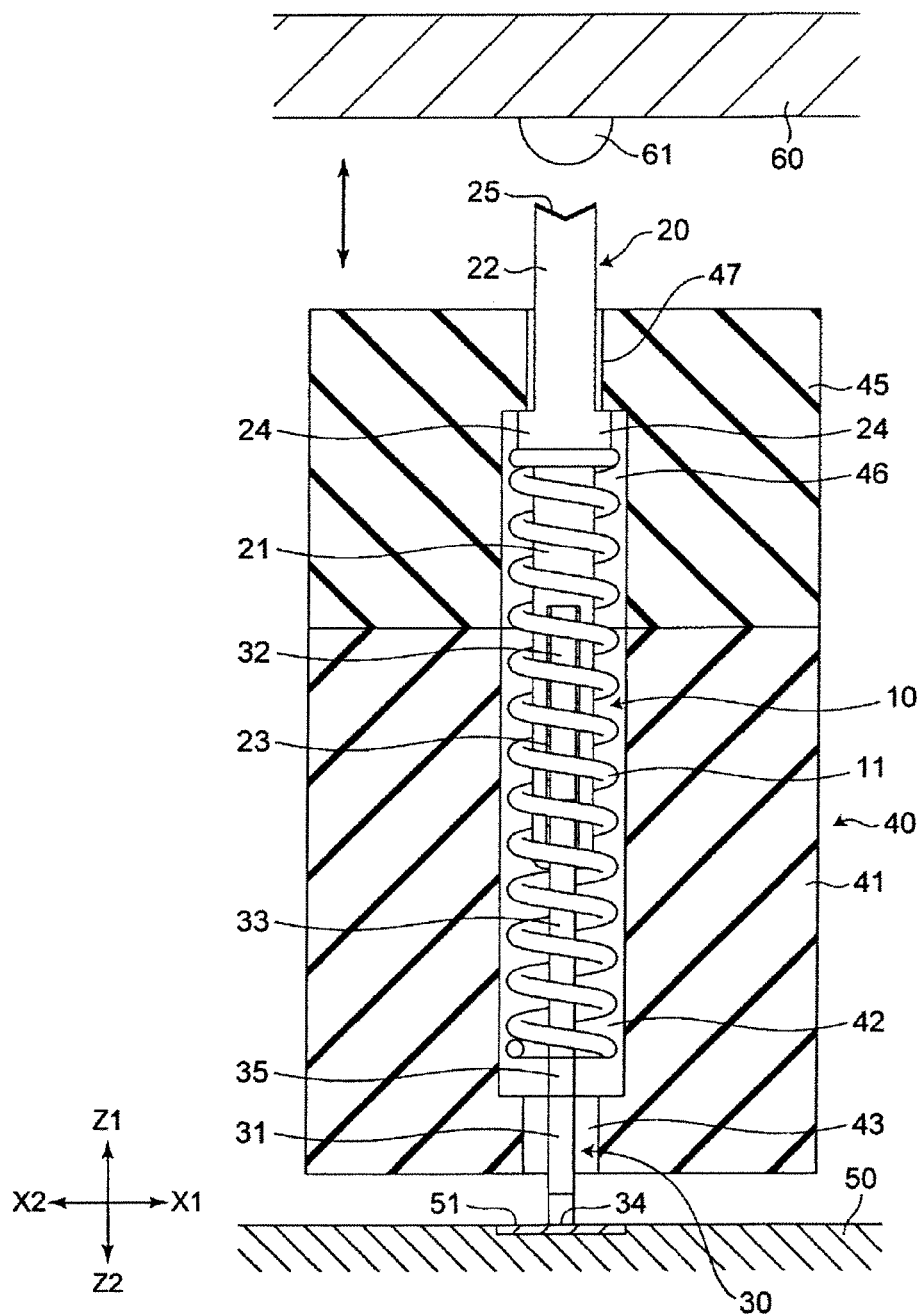
FIG. 6 is a sectional view taken along a line VI-VI of the inspection unit illustrated in FIG. 5.

The first contact part 22 has the first contact 25 at its tip (the upper end in FIG. 2). The first contact 25 has a substantially V shape as seen from the main surface. Further, as illustrated in FIG. 4(A), a contact surface of the first contact 25 is constituted by an inclined surface which is inclined so as to descend in the Y2 direction to form a wiping surface. An inclination angle is preferably 1 degree to 10 degrees, particularly preferably 2 degrees to 3 degrees. This is because, when the inclination angle is less than 1 degree, an oxide film of the ball solder cannot be efficiently scraped off, and when the inclination angle exceeds 10 degrees, the manufacturing by the electroforming method becomes difficult. Further, from both side surfaces located at the base end (the lower end in FIG. 2) of the first contact part 22, the retaining parts 24, 24 respectively extend in the X1-X2 direction. As illustrated in FIG. 6, the width dimension of each of the retaining parts 24, 24 in the X1-X2 direction is smaller than an inner diameter of a first housing hole 46 of a housing cover 45, described later, and is larger than an inner diameter of a first sliding hole 47. It is sufficient that the contact surface of at least one of the first contact 25 and the second contact 34 is inclined so as to descend along the thickness direction. Although the first contact 25 is described here, the contact surface of the second contact 34 may be made inclined so as to descend along the thickness direction.

As illustrated in FIG. 2, the second plunger 30 has a flat plate shape extending along the Z1-Z2 direction and is formed to have mostly the same thickness dimension. The second plunger 30 is made up of a second contact part 31 and the first and second elastic pieces 32, 33 extending from the base end (the upper end in FIG. 2) of the second contact part 31 in the Z1 direction. A surface along the Y1-Y2 direction of the second plunger 30 is defined as a main surface, and a surface along the X1-X2 direction orthogonal to the main surface is defined as a side surface.

The second contact part 31 has a flat plate shape having a substantially rectangular cross section, and the second contact 34 having a V shape as seen from the main surface is provided at the tip (the lower end in FIG. 2) of the second contact part 31. Further, from both side surfaces located at the base end (the upper end in FIG. 2) of the second contact part 31, the retaining parts 35, 35 respectively protrude in the Y1-Y2 direction. As illustrated in FIG. 6, similarly to the retaining parts 24, 24 described above, the width dimension of each of the retaining parts 35, 35 in the Y1-Y2 direction is smaller than an inner diameter of a second housing hole 42 of a housing body 41 described later, and is larger than an inner diameter of a second sliding hole 43.

The first and second elastic pieces 32, 33 extend from the base end of the second contact part 31 in parallel at a predetermined interval therebetween and along the Z1 direction. Further, the first and second elastic pieces 32, 33 extend from both side edges of the base end of the second contact part 31 so as to have a gap larger than the thickness dimension (Y1-Y2 direction) of the first plunger 20.

The distance between the outer surfaces of the first and second elastic pieces 32, 33, namely, the distance in the Y1-Y2 direction is substantially equal to the width dimension of the second contact part 31 in the Y1-Y2 direction. The distance between the opposed inner surfaces of the first and second elastic pieces 32, 33 is larger than the thickness dimension (Y1-Y2 direction) of the first plunger 20. The first elastic piece 32 is longer than the second elastic piece 33.

Moreover, a contact protrusion 36 protrudes toward the Y2 direction at the tip of the inner surface of the first elastic piece 32. A guide protrusion 37 protrudes toward the Y1 direction at the tip of the inner surface of the second elastic piece 33. The probe pin is formed such that, when the guide protrusion 37 of the second elastic piece 33 is fitted into the guide groove 23 of the first plunger 20, the contact protrusion 36 always comes into contact with the main surface of the clamped part 21 of the first plunger 20.

Next, a process of assembling an inspection unit 40 provided with the probe pin 10 of the first embodiment will be described. The inspection unit 40 is an example of an electronic device.

First, the probe pin 10 is assembled. First, as illustrated in FIG. 2, the clamped part 21 of the first plunger 20 is inserted from the upper end side of the coil spring 11 in the Z1 direction. Then, the first and second elastic pieces 32, 33 of the second plunger 30 are inserted from the lower end side of the coil spring 11 in the Z2 direction. At this time, as illustrated in FIG. 3(A), the first and second plungers 20, 30 are assembled such that the main surface of the first plunger 20 and the main surface of the second plunger 30 are orthogonal to each other.

When the first and second plungers 20, 30 are inserted deeply into the coil spring 11, the clamped part 21 of the first plunger 20 is inserted between the first and second elastic pieces 32, 33 of the second plunger 30. Hence, the clamped part 21 is sandwiched between the first elastic piece 32 and the second elastic piece 33. Further, when the first and second plungers 20, 30 are inserted deeply into the coil spring 11, the guide protrusion 37 of the second plunger 30 is fitted into the guide groove 23 of the first plunger 20, to connect the first and second plungers 20, 30. As a result, the assembly of the probe pin 10 having the configuration in which the first and second plungers 20, 30 are coupled to each other so as to be slidable in the coil spring 11 is completed. At this time, the contact protrusion 36 of the second elastic piece 33 of the second plunger 30 is constantly in contact with the main surface located above the guide groove 23, illustrated in FIG. 2, out of the main surface of the clamped part 21 of the first plunger 20.

Next, as illustrated in FIGS. 5, 6(A) and 6(B), the assembled probe pin 10 is assembled into the insulative housing of the inspection unit 40.

That is, the second plunger 30 is inserted into the second housing hole 42 provided in the insulating housing body 41 constituting the housing. Then, after the second contact part 31 and the first and second elastic pieces 32, 33 of the second plunger 30 are respectively housed into the second sliding hole 43 and the second housing hole 42 of the housing body 41, the housing body 41 is covered with an insulating housing cover 45. As a result, the clamped part 21 and the first contact part 22 of the first plunger 20 are respectively housed into the first housing hole 46 and the first sliding hole 47 of the housing cover 45, and the assembling work of the inspection unit 40 is completed.

As illustrated in FIG. 6, in the inspection unit 40, the assembling work of which has completed, the retaining part 24 of the first plunger 20 is engaged with the inner opening edge of the first sliding hole 47 of the housing cover 45. Similarly, the retaining part 35 of the second plunger 30 is engaged with the inner opening edge of the second sliding hole 43 of the housing body 41. Then, the coil spring 11 is compressed by the retaining part 24 and the retaining part 35. Further, the first contact part 22 of the first plunger 20 protrudes from the first sliding hole 47 of the housing cover 45. Similarly, the second contact part 31 of the second plunger 30 protrudes from the second sliding hole 43 of the housing body 41.

When the inspection unit 40 having a large number of probe pins 10 is to be assembled, the same assembling work as described above may be repeated.

Next, the operation of the probe pin 10 assembled in the inspection unit 40 will be described.

First, the second contact part 31 of the inspection unit 40 is positioned above a printed wiring board 50, and the inspection unit 40 is lowered. Thereby, the second contact 34 of the second contact part 31 is pressed against a connection pad 51 of the printed wiring board 50. Hence, the coil spring 11 is further compressed through the retaining part 35 of the second plunger 30.

Then, an inspection object 60 is positioned above the inspection unit 40, and the inspection object 60 is lowered. Thereby, a ball solder 61 of the inspection object 60 is pressed against the first contact 25, having the V shaped cross section, of the first plunger 20. Hence, the retaining part 24 of the first plunger 20 pushes down and compresses the coil spring 11. As a result, the clamped part 21 of the first plunger 20 descends and the guide protrusion 37 of the second plunger 30 slides in the guide groove 23 of the first plunger 20. At the same time, the contact protrusion 36 of the second plunger 30 slides on the main surface of the clamped part 21 of the first plunger and is electrically connected. It is thereby possible to inspect whether or not the inspection object 60 normally operates.

According to the present embodiment, as illustrated in FIGS. 4(A) and 4(B), the contact surface of the first contact 25 is inclined so as to descend in the Y2 direction. Therefore, the ball solder 61 slides along the wiping surface which is the contact surface descending in the Y2 direction, and the oxide film of the ball solder 61 is scraped off on the contact surface of the first contact 25. As a result, contact failure does not occur and variation in inspection accuracy does not occur.

Particularly, when the ball solder 61 comes into partial contact with the first contact 25, the ball solder 61 is also scraped along the V shaped inclined surface of the first contact 25. Thus, since the oxide film of the ball solder 61 is more reliably scraped off, contact failure is less likely to occur and the inspection accuracy is improved.

Further, since the contact surface of the first contact 25 has a V shape, there is an advantage that the ball solder 61 hardly falls off when the ball solder 61 comes into contact with the contact surface of the first contact 25.

Finally, when the inspection object 60 is pulled up and the ball solder 61 is released from the first contact 25, the retaining part 24 of the first plunger 20 is pushed up by the spring force of the coil spring 11. Then, the retaining part 24 of the first plunger 20 is engaged with the inner edge of the first sliding hole 47 of the housing cover 45, and returns to the initial state. Thereafter, repeating a similar operation enables inspection of the inspection object 60.

When the guide protrusion 37 of the second plunger 30 is fitted in the guide groove 23 of the first plunger 20, the contact protrusion 36 of the second elastic piece 32 is constantly pressed against the main surface of the clamped part 21 of the first plunger 20. Hence, it is possible to ensure high contact stability between the first and second plungers 20, 30.

The relative sliding movement of the first and second plungers 20, 30 is performed by the guide protrusion 37 of the second plunger 30 being engaged with the guide groove 23 of the first plunger 20. There is thus no variation in the contact position between the clamped part 21 of the first plunger 20 and the contact protrusion 36 of the second plunger 30, and an inspection unit having no variation in inspection accuracy can be obtained.

Figure 25:
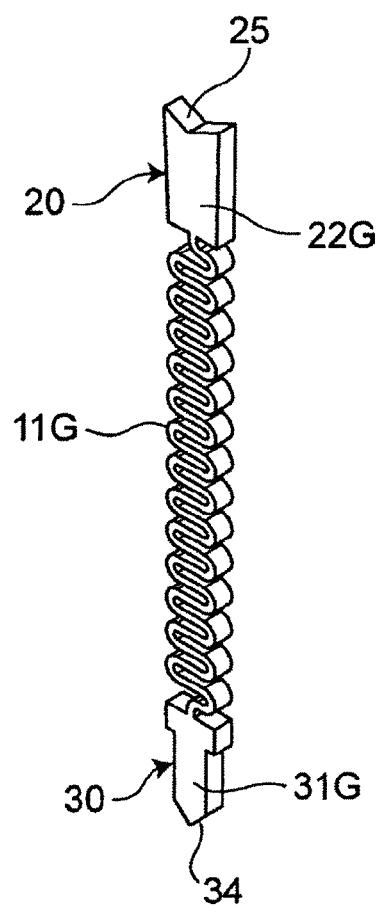
FIG. 25 is a partial perspective view illustrating a probe pin according to a modification of the first embodiment of the present invention.
Figure 26A:
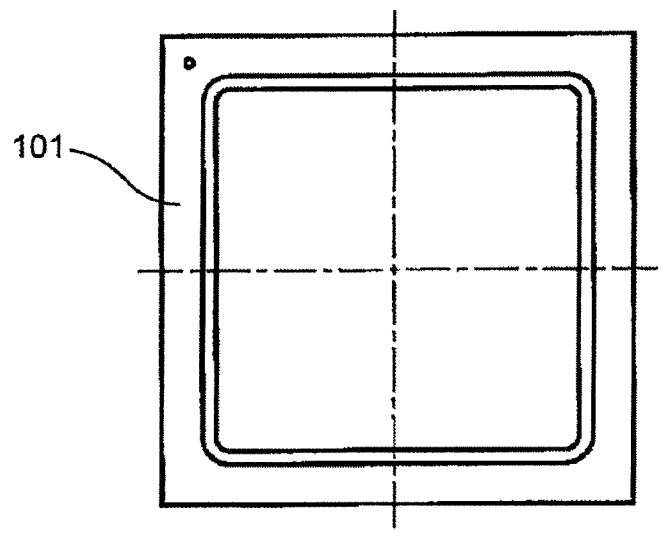
FIG. 26A is a plan view of a semiconductor IC of Patent Document 1.
Figure 26B:
FIG. 26B is a side view of the semiconductor IC of Patent Document 1.
Figure 26C:
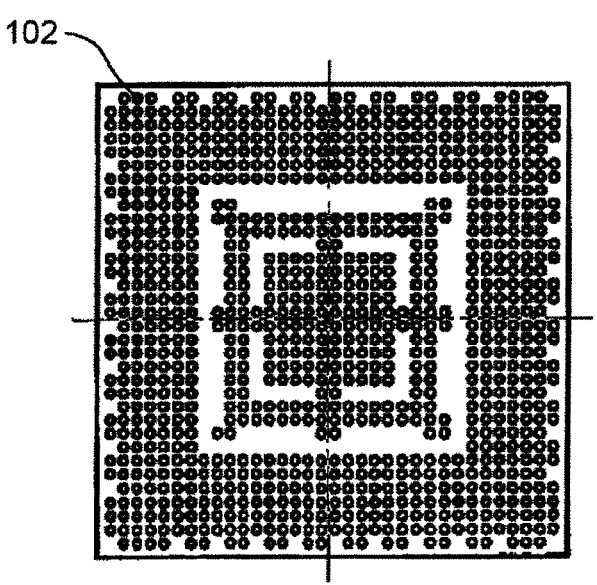
FIG. 26C is a rear view of the semiconductor IC of Patent Document 1.
Figure 27:
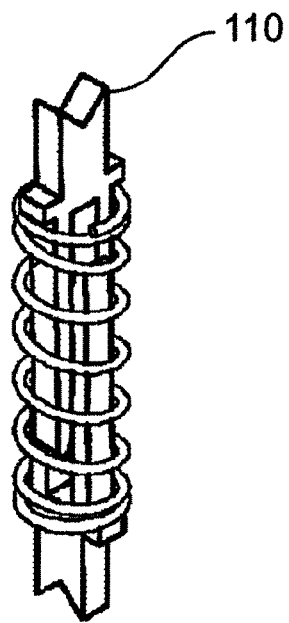
FIG. 27 is a perspective view of a probe pin of Patent Document 1.
Figure 28:
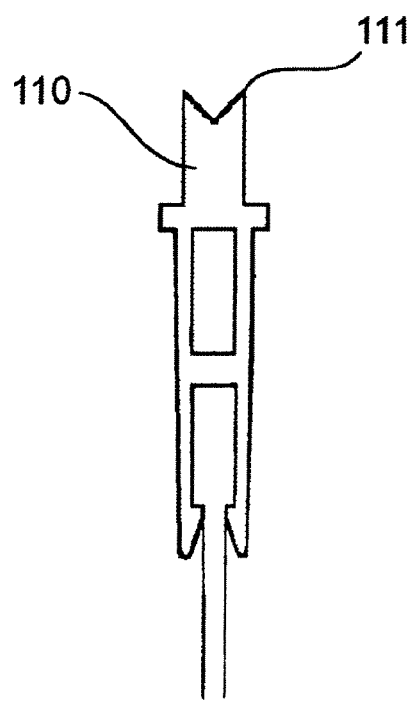
FIG. 28 is a front view of the probe pin of Patent Document 1.

In the first embodiment, as illustrated in FIG. 25, as another example of the elastic part, the elastic part may be made up of a bellows-shaped elastic body 11G in place of the coil spring 11, and may have a form in which a first contact part 22G provided with the first contact 25 and a second contact part 31G provided with the second contact 34 are integrally molded so as to be mutually reciprocable via the elastic body 11G. With such a configuration, the structure can be simplified.

Figure 7:
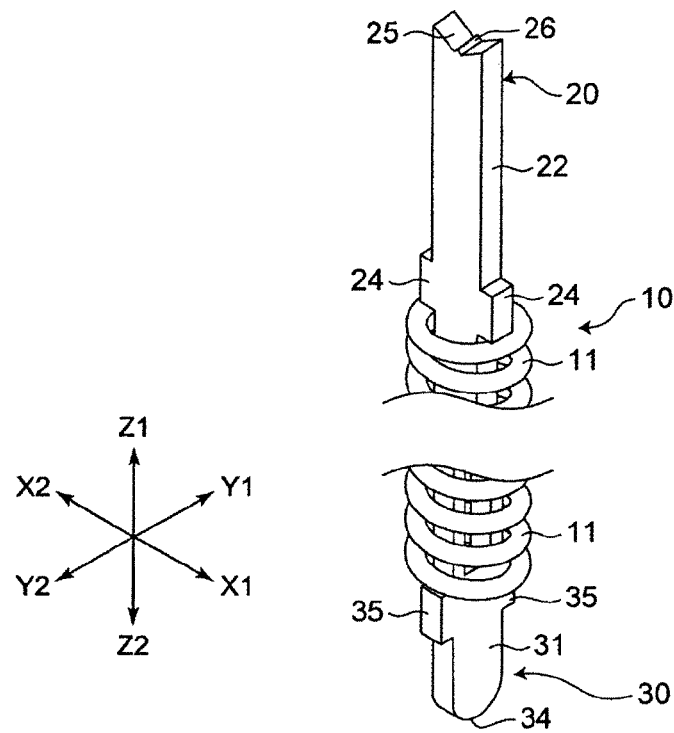
FIG. 7 is a partial perspective view illustrating a probe pin according to a second embodiment of the present invention.
Figure 8:
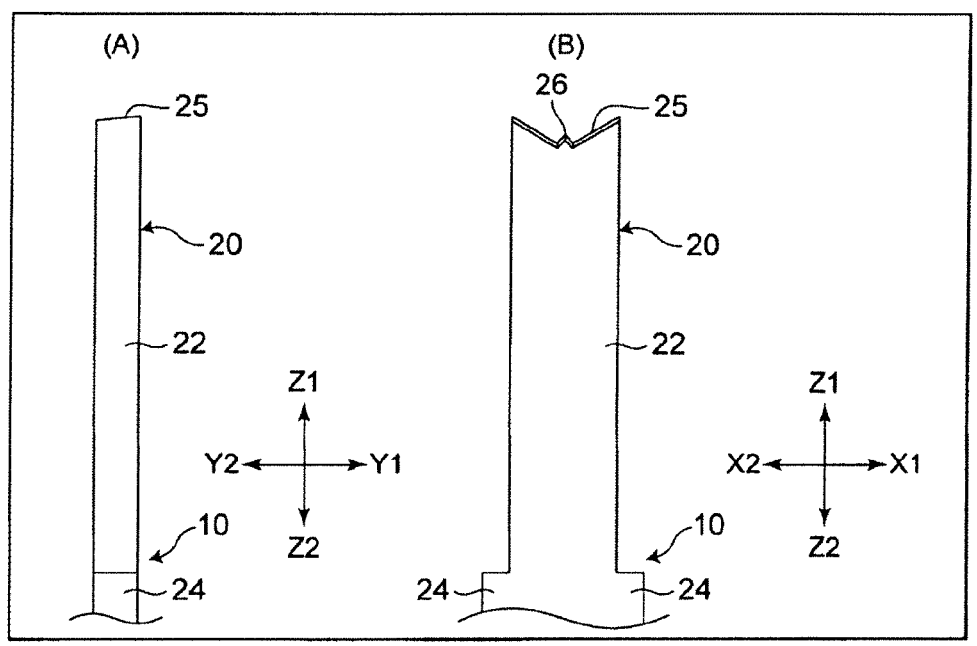
FIGS. 8(A) and 8(B) are a partial enlarged left side view and a partial enlarged rear view of the probe pin illustrated in FIG. 7.

As illustrated in FIGS. 7, 8(A) and 8(B), a probe pin according to a second embodiment is mostly the same as the above first embodiment, and the difference from the first embodiment is that a peeling projection 26 having a triangular cross section is provided in the center of the V shaped first contact 25 along the thickness direction. Since the others are similar to those in the above first embodiment, the same portions are provided with the same numerals, and descriptions thereof are omitted.

According to the embodiment, since the peeling projection 26 can more reliably peel off the oxide film of the ball solder, there is an advantage that the inspection accuracy is improved.

Figure 9:
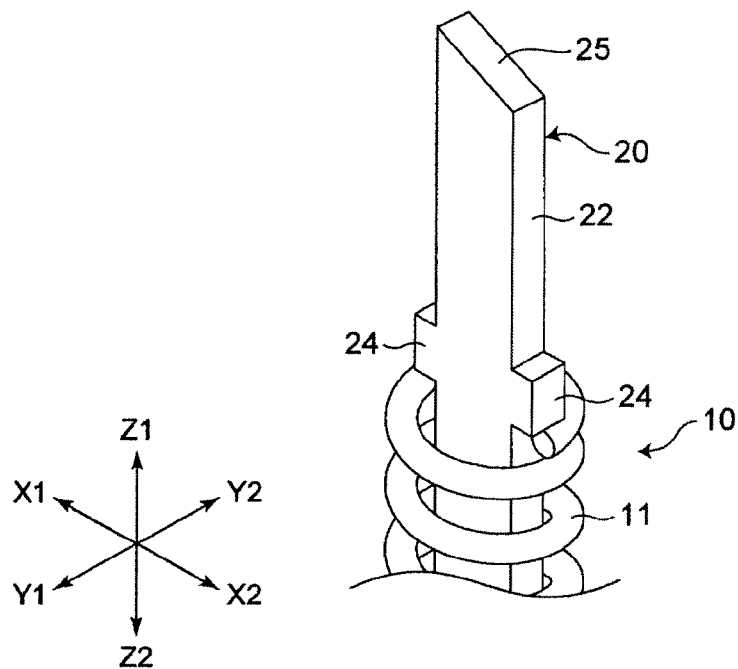
FIG. 9 is a partial perspective view illustrating a probe pin according to a third embodiment of the present invention.
Figure 10:
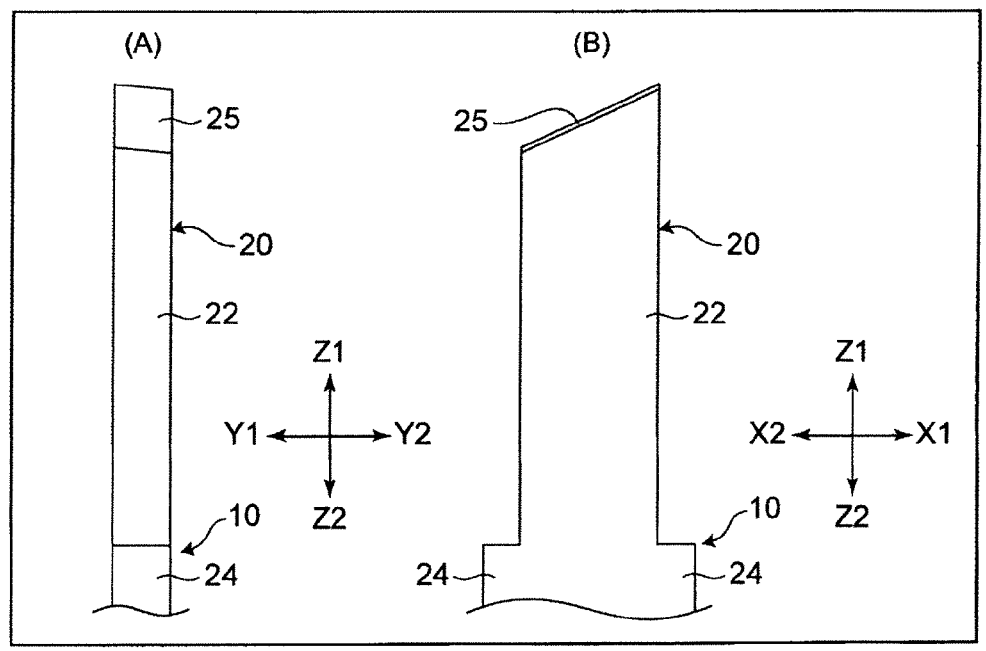
FIGS. 10(A) and 10(B) are a partial enlarged left side view and partial enlarged rear view of the probe pin illustrated in FIG. 9.

As illustrated in FIGS. 9, 10(A) and 10(B), a probe pin according to a third embodiment is mostly the same as the above first embodiment except that the contact surface of the first contact 25 is inclined so as to descend in the X2 direction and is made a flat surface. Furthermore, the contact surface of the first contact 25 is inclined so as to also descend in the Y2 direction.

According to the embodiment, when the ball solder comes into contact with the contact surface of the first contact 25, the ball solder slides along the diagonal line of the contact surface of the first contact 25 and is scraped. Therefore, even when the cross-sectional area of the contact surface of the first contact part 22 is small, the ball solder slides a long distance. As a result, the oxide film of the ball solder can be reliably scraped off, and there is thus an advantage that it is possible to obtain a probe pin in which contact failure hardly occurs.

Figure 11:
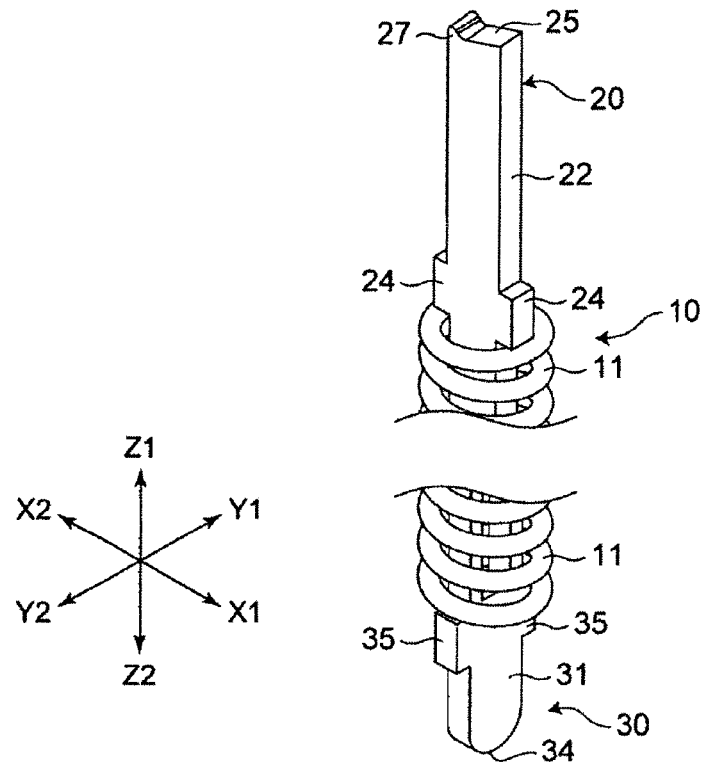
FIG. 11 is a partial perspective view illustrating a probe pin according to a fourth embodiment of the present invention.
Figure 12:
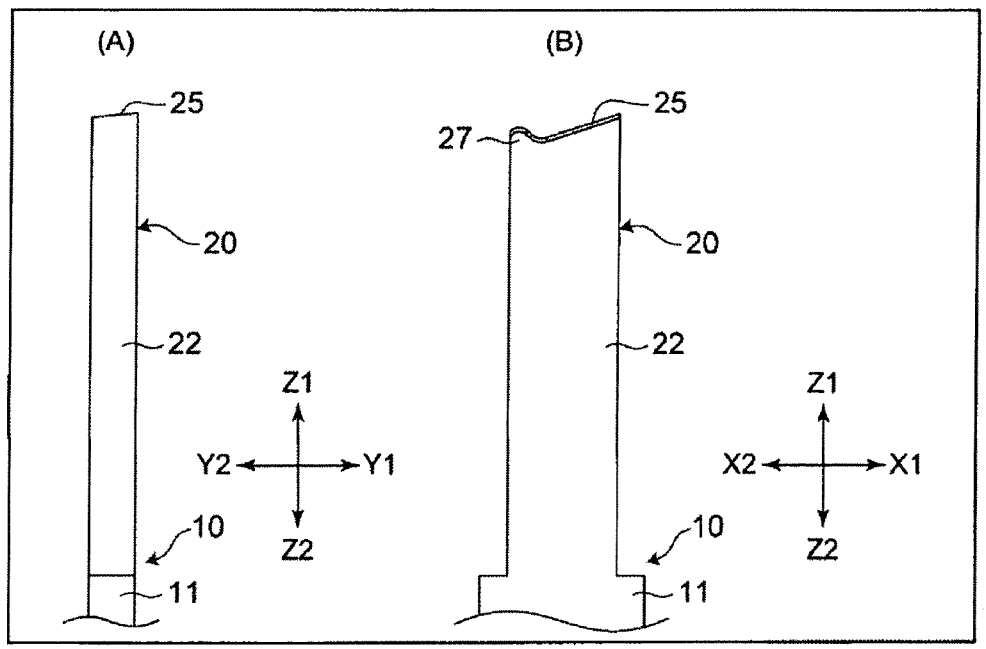
FIGS. 12(A) and 12(B) are a partial enlarged left side view and a partial enlarged rear view of the probe pin illustrated in FIG. 11.

As illustrated in FIGS. 11, 12(A) and 12(B), a probe pin according to a fourth embodiment is mostly the same as the above third embodiment except that an engagement projection 27 is provided on the X2 side edge of the contact surface of the first contact 25. As in the third embodiment, the contact surface of the first contact 25 is inclined so as to descend in the Y2 direction as well.

According to the embodiment, when a ball solder (not shown) comes into contact with the contact surface of the first contact 25, the oxide film of the ball solder is scraped along the contact surface of the first contact 25 and an oxide film is peeled off. It is thus possible to obtain a probe pin in which contact failure hardly occurs. In addition, since the ball solder is engaged with the engagement projection 27, there is an advantage that the ball solder hardly falls off.

Figure 13:
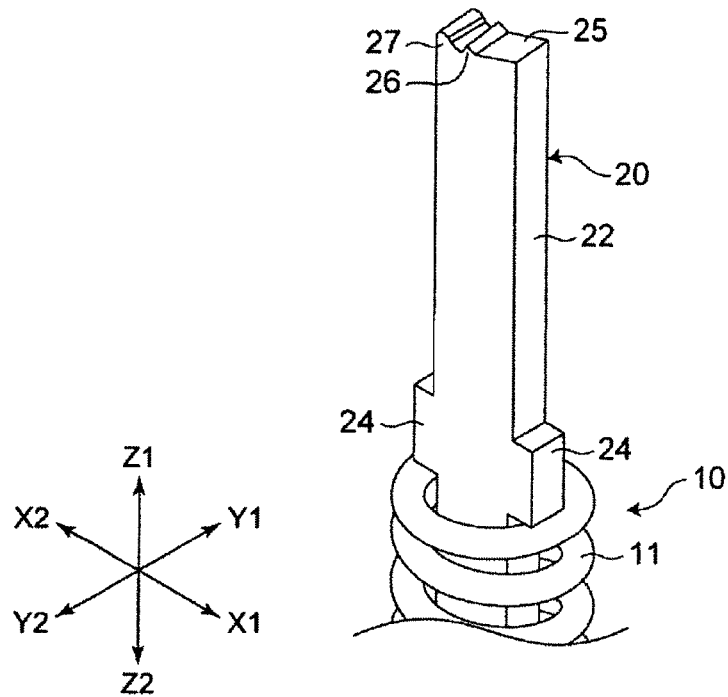
FIG. 13 is a partial perspective view illustrating a probe pin according to a fifth embodiment of the present invention.
Figure 14:
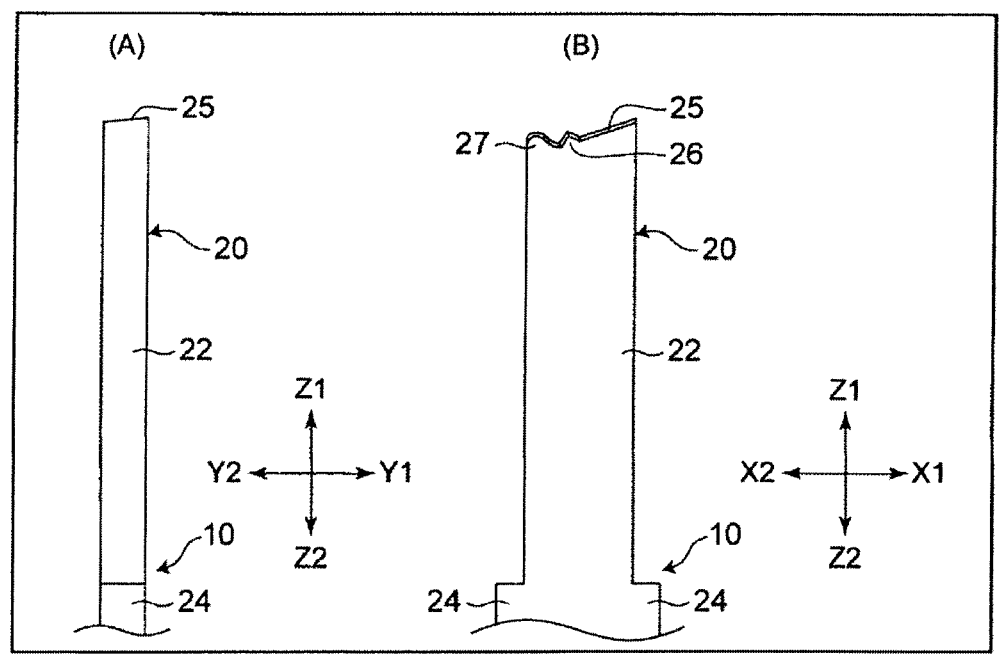
FIGS. 14(A) and 14(B) are a partial enlarged left side view and a partial enlarged rear view of the probe pin illustrated in FIG. 13.

As illustrated in FIGS. 13, 14(A) and 14(B), a probe pin according to a fifth embodiment is mostly the same as the above fourth embodiment except that the peeling projection 26 having a triangular cross section is provided at the base part of the engagement projection 27 of the first contact 25 in the thickness direction. In addition, the contact surface of the first contact 25 is inclined so as to descend in the Y2 direction.

According to the embodiment, there is an advantage that the oxide film of the ball solder is more reliably scraped off by the peeling projection 26, and contact failure hardly occurs.

Figure 15:
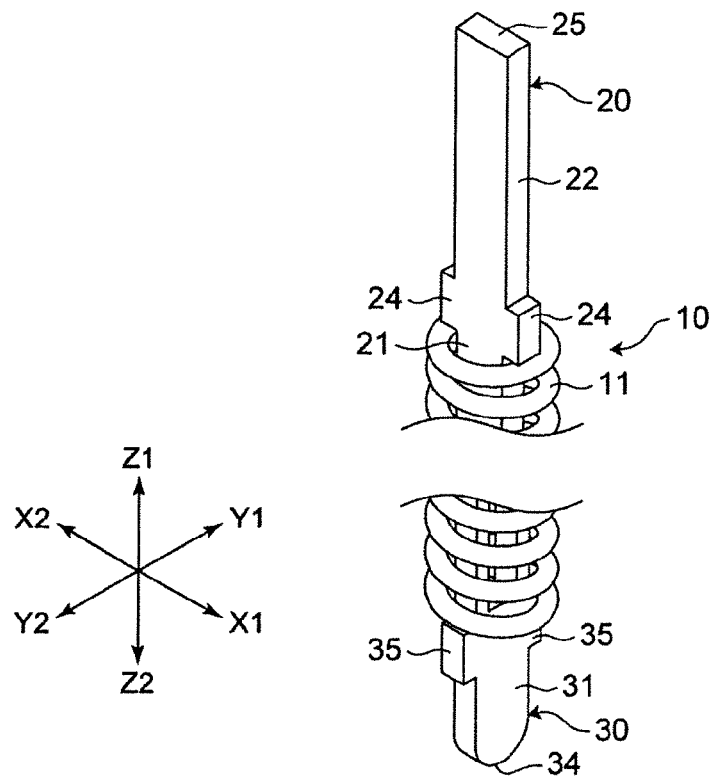
FIG. 15 is a partial perspective view illustrating a probe pin according to a sixth embodiment of the present invention.
Figure 16:
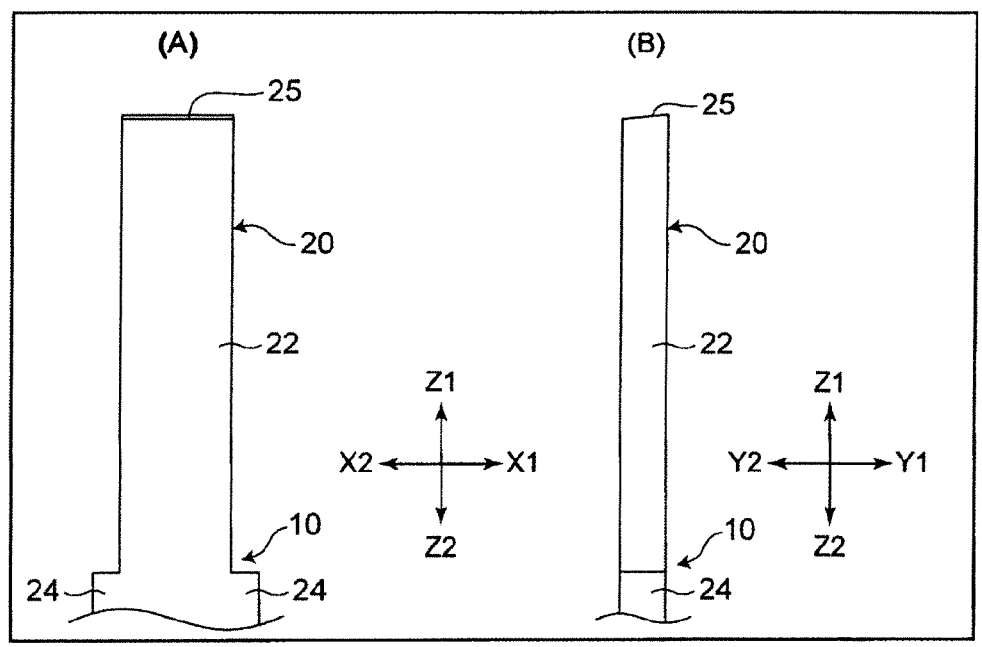
FIGS. 16(A) and 16(B) are a partial enlarged rear view and a partial enlarged left side view of the probe pin illustrated in FIG. 15.

As illustrated in FIGS. 15, 16(A) and 16(B), a probe pin according to a sixth embodiment is mostly the same as the above first embodiment except that the first contact 25 has a flat contact surface along the X1 direction and the X2 direction. Further, as illustrated in FIG. 16(B), the contact surface of the first contact 25 is inclined so as to descend in the Y2 direction.

According to the embodiment, since the shape of the first contact 25 is simple, there is an advantage that the probe pin 10 with the first plunger 20 easy to manufacture can be obtained.

Figure 17:
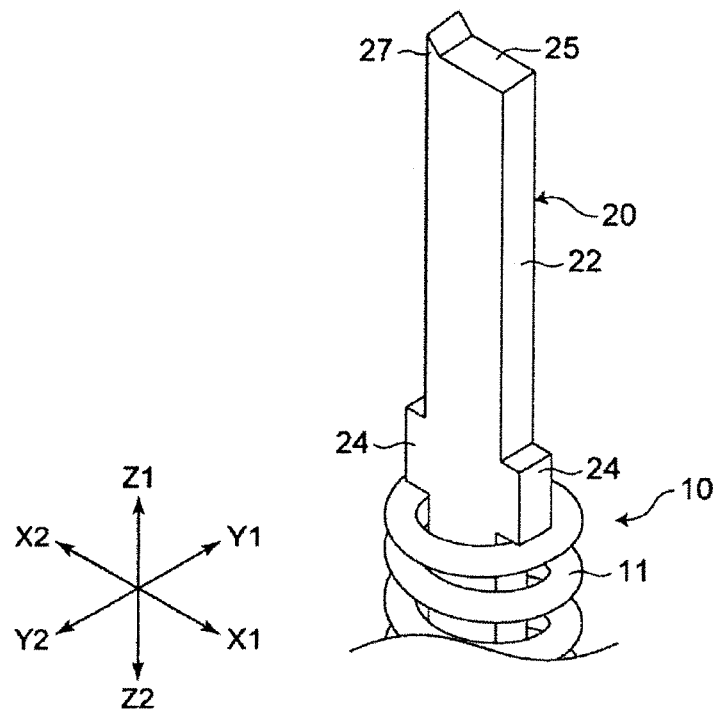
FIG. 17 is a partial perspective view illustrating a probe pin according to a seventh embodiment of the present invention.
Figure 18:
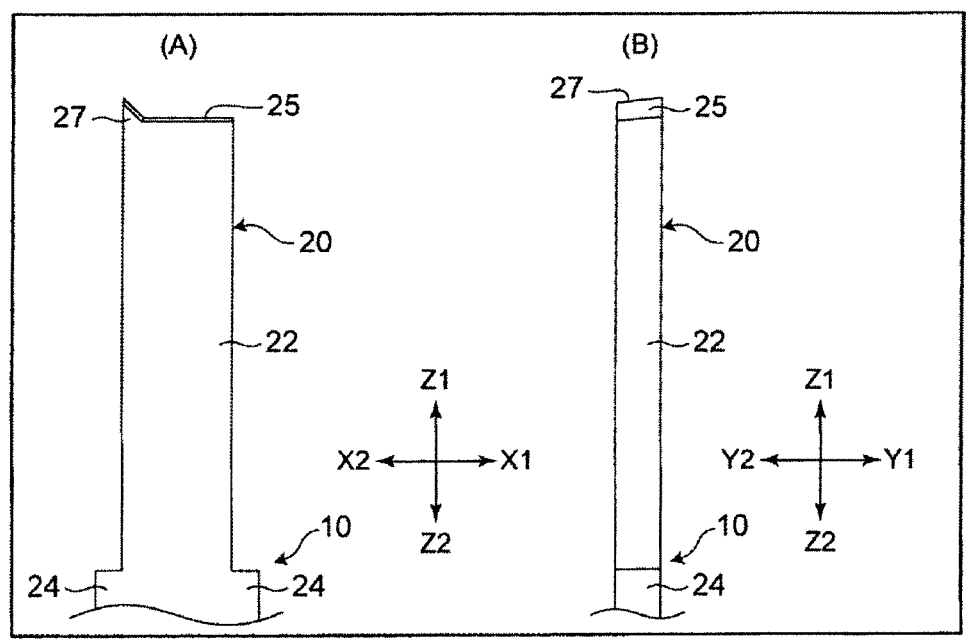
FIGS. 18(A) and 18(B) are a partial enlarged rear view and a partial enlarged left side view of the probe pin illustrated in FIG. 17.

As illustrated in FIGS. 17, 18(A) and 18(B), a probe pin according to a seventh embodiment is mostly the same as the above sixth embodiment except that the engagement projection 27 having a triangular cross section is provided at the edge in the X2 direction side of the contact surface of the first contact 25 in the thickness direction (Y1-Y2 direction). As in the sixth embodiment, the contact surface of the first contact 25 is inclined so as to descend in the Y2 direction, as illustrated in FIG. 18(B).

According to the embodiment, the ball solder slides on the contact surface of the first contact 25 which is inclined so as to descend in the Y2 direction, and the oxide film of the ball solder is scraped off. Hence, a probe pin free from contact failure can be obtained. Further, since the ball solder is engaged with the engagement projection 27, there is an advantage that the ball solder hardly falls off.

Figure 19:
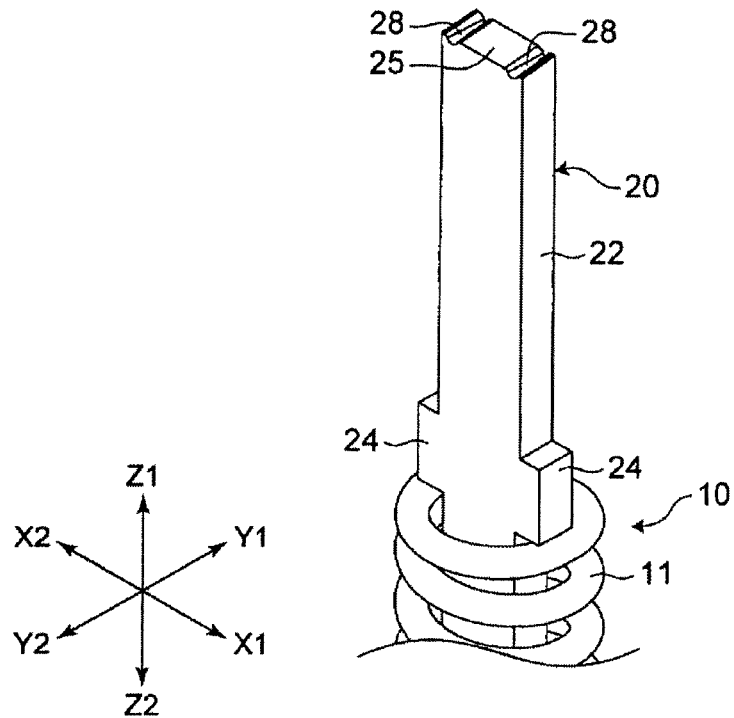
FIG. 19 is a partial perspective view illustrating a probe pin according to an eighth embodiment of the present invention.
Figure 20:
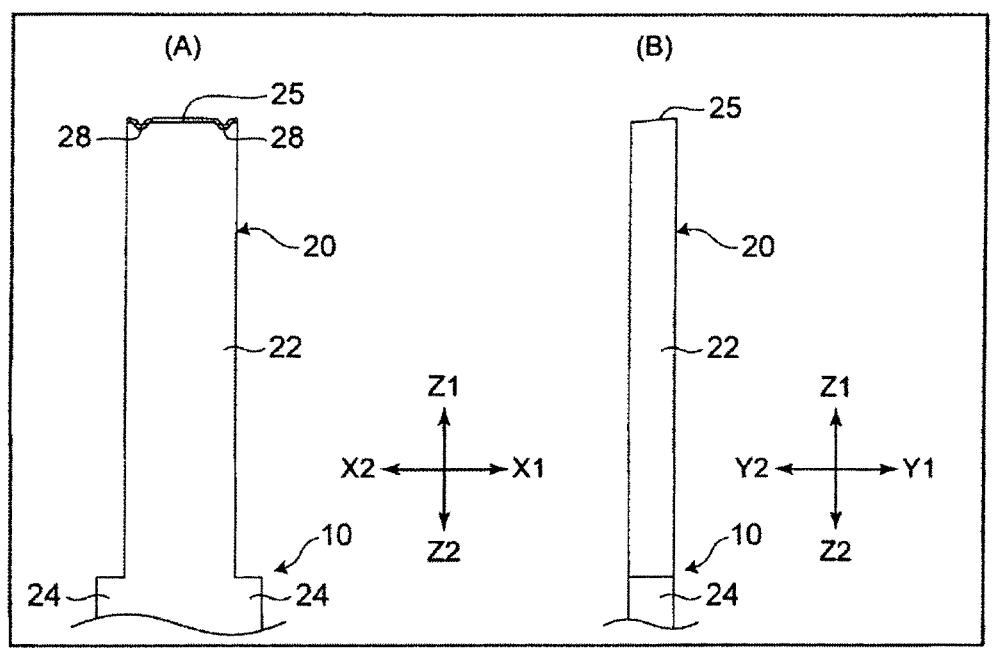
FIGS. 20(A) and 20(B) are a partial enlarged rear view and a partial enlarged left side view of the probe pin illustrated in FIGS. 18(A) and 18(B).

As illustrated in FIGS. 19, 20(A) and 20(B), a probe pin according to an eighth embodiment is mostly the same as the above sixth embodiment except that peeling grooves 28, 28 are provided at both side edges of the contact surface of the first contact 25 in parallel along the Y2 direction. As in the sixth embodiment, the contact surface of the first contact 25 is inclined so as to descend in the Y2 direction, as illustrated in FIG. 20(B).

According to the embodiment, the oxide film of the ball solder is scraped off by the peeling grooves 28, 28 provided along the Y1-Y2 direction. Hence, a probe pin free from contact failure can be obtained. In addition, since the ball solder is likely to be caught in the peeling groove 28, the ball solder hardly falls off.

Figure 21:
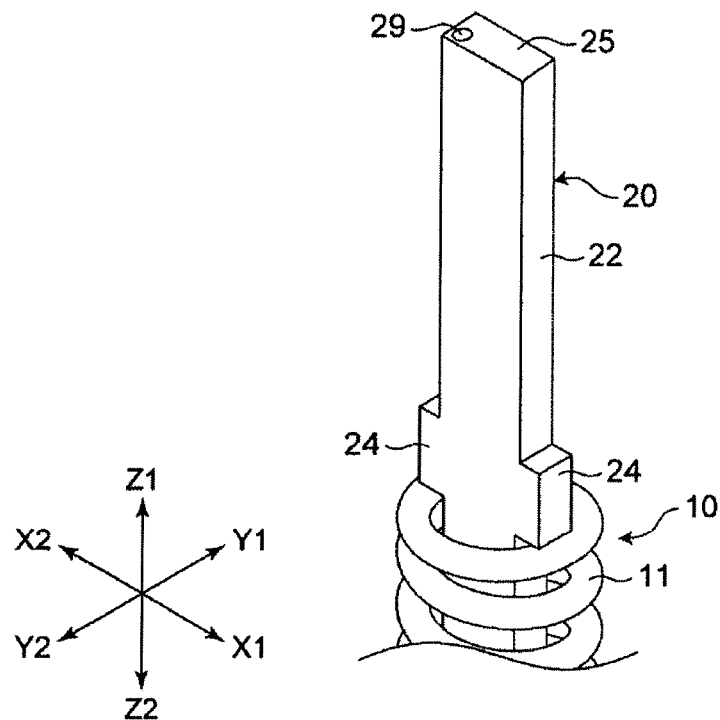
FIG. 21 is a partial perspective view illustrating a probe pin according to a ninth embodiment of the present invention.
Figure 22:
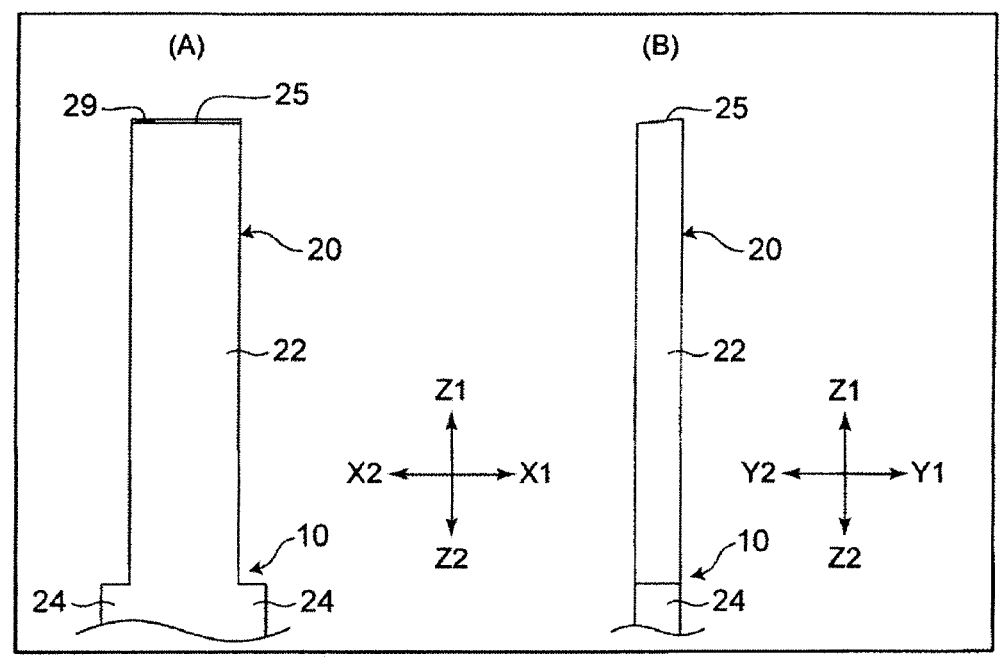
FIGS. 22(A) and 22(B) are a partial enlarged rear view and a partial enlarged left side view of the probe pin illustrated in FIG. 21.

As illustrated in FIGS. 21, 22(A) and 22(B), a probe pin according to a ninth embodiment is mostly the same as the above sixth embodiment except that a recess 29 is formed at the corner in the X2 direction and the Y2 direction of the contact surface of the first contact 25. As in the sixth embodiment, the contact surface of the first contact 25 is inclined so as to descend in the Y2 direction, as illustrated in FIG. 22(B).

According to the embodiment, since the oxide film of the ball solder is scraped off in the recess 29 of the first contact 25, a probe pin free from contact failure can be obtained. The contact reliability is improved. In addition, since the ball solder is likely to be caught in the peeling groove 28, the ball solder hardly falls off.

Figure 23:
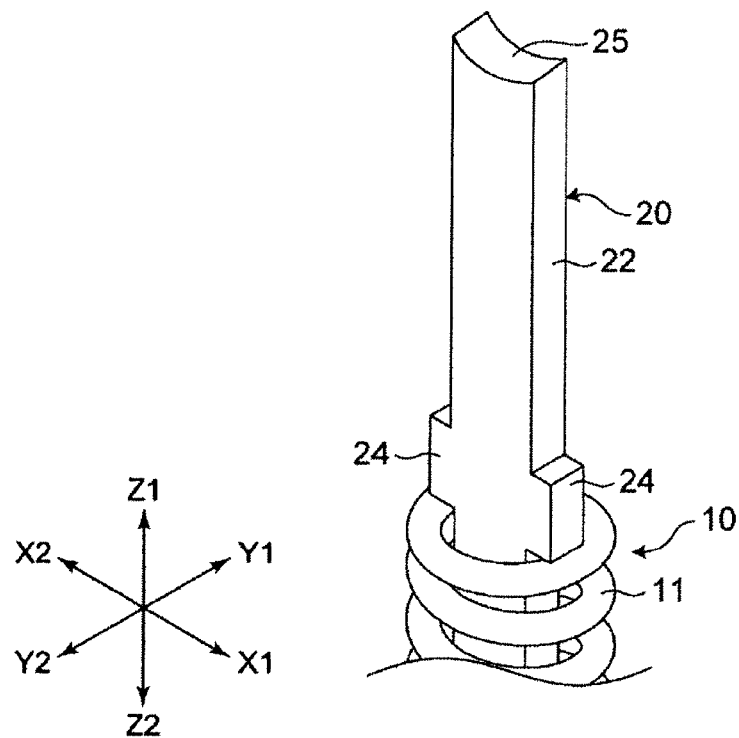
FIG. 23 is a partial perspective view illustrating a probe pin according to a tenth embodiment of the present invention.
Figure 24:
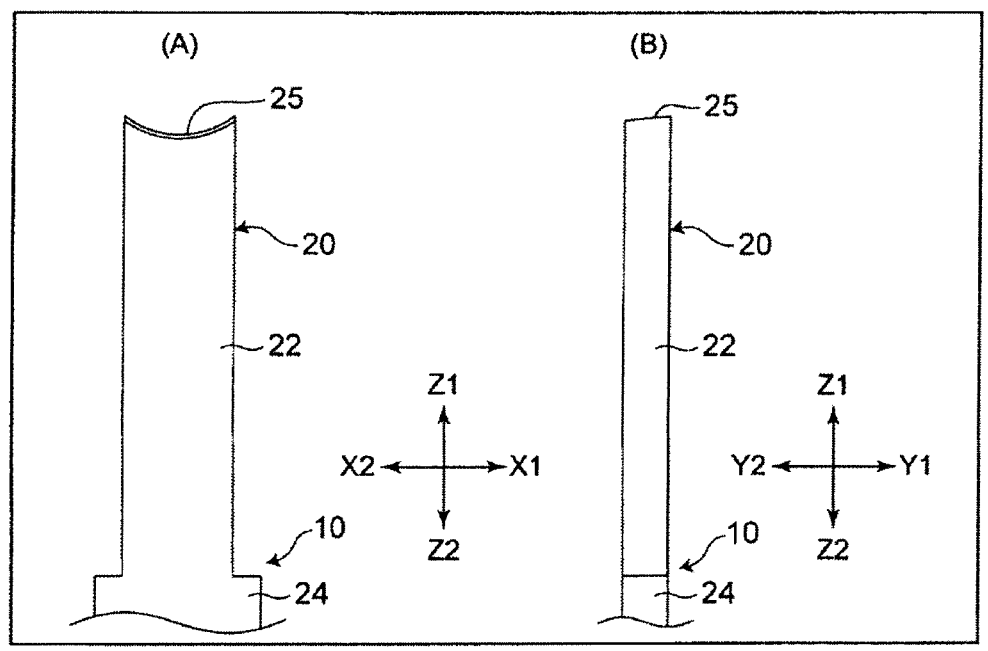
FIGS. 24(A) and 24(B) are partial enlarged rear view and partial enlarged left side view of the probe pin illustrated in FIG. 23.

As illustrated in FIGS. 23, 24(A) and 24(B), a probe pin according to a tenth embodiment is mostly the same as the above sixth embodiment except that the contact surface of the first contact 25 is an arcuate surface. Further, as illustrated in FIG. 24(B), the first contact 25 is inclined so as to descend in the Y2 direction.

According to the embodiment, the ball solder slides on the contact surface of the first contact 25 and the oxide film of the ball solder is scraped off, so that a probe pin free from contact failure can be obtained. In particular, since the contact surface of the first contact 25 has an arcuate surface, the contact area is large and contact reliability is further improved. In addition, since the first contact 25 is an arcuate surface, there is an advantage that a probe pin with which the ball solder hardly falls off can be obtained.

A variety of embodiments of the present invention have been described in detail with reference to the drawings, and lastly, a variety of aspects of the present invention will be described.

For solving the above problem, a probe pin according to a first aspect of the present invention is a probe pin that includes: an elastic part extending and contracting along a center line; a first contact disposed on one side of the center line and having a rectangular cross section; and a second contact on the other side of the center line and having a rectangular cross section, in which the first contact and the second contact are supported so as to be reciprocable via the elastic part and are electrically connected to each other, and it is configured such that a contact surface of at least one of the first contact and the second contact is an inclined surface inclined so as to descend along a thickness direction.

According to the first aspect of the present invention, when a ball solder comes into contact with the inclined contact surface of the contact, the ball solder slides on the contact surface, so that the oxide film of the ball solder is scraped off. Therefore, contact failure hardly occurs, and probe pins having no variation in inspection accuracy can be obtained.

In a second aspect of the present invention, in the first aspect, the probe pin may include: a coil spring being the elastic part; a first plunger including a first contact part provided with the first contact; and a second plunger including a second contact part provided with the second contact, and the first and second plungers inserted respectively from both ends of the coil spring may be connected to each other so as to be slidable in the coil spring.

In a third aspect of the present invention, in the second aspect, the first and second plungers may be electroformed products.

In a fourth aspect of the present invention, in the first aspect, the elastic part may be a bellows-shaped elastic body, and the probe pin may have a shape in which the first contact part provided with the first contact and the second contact part provided with the second contact are integrally molded so as to be reciprocable mutually via the elastic body.

In a fifth aspect of the present invention, in the fourth aspect, the integral elastic body and the first and second contact parts may be electroformed products.

In a sixth aspect of the present invention, in any one of the first to fifth aspects, at least one of the first contact and the second contact may have a V shape.

In a seventh aspect of the present invention, in the sixth aspect, in particular, a peeling projection may be provided along the thickness direction at a center of the contact of the V shaped cross section.

In an eighth aspect of the present invention, in any one of the first to fifth aspects, at least one of the first contact and the second contact may have an inclined surface that is inclined along a width direction orthogonal to the thickness direction.

In a ninth aspect of the present invention, in the eighth aspect, an engagement projection may be provided along the thickness direction at a lower side edge of the contact.

In a tenth aspect of the present invention, in the ninth aspect, a peeling projection may be provided along the thickness direction on a base part of the engagement projection.

In an eleventh aspect of the present invention, in any one of the first to fifth aspects, at least one of the first contact and the second contact may be an inclined surface extending along a width direction orthogonal to the thickness direction.

In a twelfth aspect of the present invention, in any one of the first to fifth aspects, a peeling groove may be formed at at least one edge of both side edges of the contact surface of the contact along the thickness direction.

In a thirteenth aspect of the present invention, in any one of the first to fifth aspects, at least one recess may be provided on the contact surface of the contact.

An electronic device according to a fourteenth aspect of the present invention includes the probe pin in any one of the first to thirteenth aspects.

According to the various aspects of the present invention, when the ball solder comes into contact with the inclined contact surface of the probe pin, the ball solder is scraped at the contact surface and the oxide film of the ball solder is scraped off. Therefore, contact failure is less likely to occur, and there is an effect that an electronic device with uniform inspection accuracy can be obtained.

Note that by appropriately combining freely selected embodiments or modifications of the above variety of embodiments and modifications, it is possible to achieve the respective effects of those combined. While it is possible to combine embodiments, combine examples, or combine an embodiment and an example, it is also possible to combine features in different embodiments or examples.

While the present invention has been fully described in connection with the preferred embodiments with reference to the accompanying drawings, a variety of modifications or corrections will be apparent to those skilled in the art. Such modifications or corrections are to be understood as being included in the scope of the invention according to the appended claims so long as not deviating therefrom.

INDUSTRIAL APPLICABILITY

It is a matter of course that the probe pin according to the above aspect of the present invention is not limited to the above-described inspection unit, but may be applied to other electronic devices.

DESCRIPTION OF SYMBOLS

10 probe pin
11 coil spring (example of elastic part)

20 first plunger
21 clamped part
22 first contact part
23 guide groove
24 retaining part
25 first contact
26 peeling projection
27 engagement projection
28 peeling groove
29 recess
30 second plunger
31 second contact part
32 first elastic piece
33 second elastic piece
34 second contact
35 retaining part
36 contact protrusion
37 guide protrusion
40 inspection unit
41 housing body
42 second storage hole
43 second sliding hole
45 housing cover
46 first storage hole
47 first sliding hole
50 printed wiring board
51 connection pad
60 inspection object
61 ball solder

The invention claimed is:

1. A plate shaped probe pin, comprising:
an elastic part extending and contracting along a center line;
a first contact disposed on one side of the center line and having a rectangular cross section; and
a second contact disposed on another side of the center line and having a rectangular cross section, wherein
the first contact and the second contact are supported so as to be reciprocable via the elastic part and are electrically connected to each other,
the second surface includes an inclined surface which is inclined along a thickness direction of the probe pin and a width direction orthogonal to the thickness direction,
when the second contact is pressed against a plane of an inspection, a tip of the inclined surface in the extending direction comes into contact with the plane,
the first contact includes an inclined surface which is disposed in an end face of the first contact in the extending direction and inclined along the thickness direction,
the first contact has an asymmetrical V shape with respect to a center of the first contact in the width direction, and
an engagement projection which can engage in the width direction an inspection contacted to the first contact is provided with an end portion of the first contact in the width direction which is close to the second contact in the extending direction.

2. The probe pin according to claim 1, wherein the first contact includes a peeling projection that is positioned nearer than the center of the first contact in the width direction.

3. The probe pin according to claim 1, comprising:
a coil spring being the elastic part;
a first plunger including a first contact part provided with the first contact; and
a second plunger including a second contact part provided with the second contact,
wherein the first and second plungers inserted respectively from both ends of the coil spring are coupled to each other so as to be slidable in the coil spring.

4. The probe pin according to claim 3, wherein the first and second plungers are electroformed products.

5. The probe pin according to claim 1, wherein the elastic part is a bellows-shaped elastic body, and the probe pin has a shape in which the first contact part provided with the first contact and the second contact part provided with the second contact are integrally molded so as to be reciprocable mutually via the elastic body.

6. The probe pin according to claim 5, wherein the integral elastic body and the first and second contact parts are electroformed products.

7. An electronic device comprising the probe pin according to claim 1.

8. A plate shaped probe pin, comprising:
an elastic part extending and contracting along a center line;
a first contact disposed on one side of the center line and having a rectangular cross section; and
a second contact disposed on another side of the center line and having a rectangular cross section, wherein
the first contact and the second contact are supported so as to be reciprocable via the elastic part and are electrically connected to each other,
the second contact includes an inclined surface which is inclined along a thickness direction of the probe pin and a width direction orthogonal to the thickness direction,
when the second contact is pressed against a plane of an inspection, a tip of the inclined surface in the extending direction comes into contact with the plane, and
the first contact includes a flat section extending along the width direction and an engagement projection, which can engage in the width direction an inspection contacted to the first contact, disposed at an end of the flat section in the width direction.

9. The probe pin according to claim 8, comprising:
a coil spring being the elastic part;
a first plunger including a first contact part provided with the first contact; and
a second plunger including a second contact part provided with the second contact,
wherein the first and second plungers inserted respectively from both ends of the coil spring are coupled to each other so as to be slidable in the coil spring.

10. The probe pin according to claim 9, wherein the first and second plungers are electroformed products.

11. The probe pin according to claim 8, wherein the elastic part is a bellows-shaped elastic body, and the probe pin has a shape in which the first contact part provided with the first contact and the second contact part provided with the second contact are integrally molded so as to be reciprocable mutually via the elastic body.

12. The probe pin according to claim 11, wherein the integral elastic body and the first and second contact parts are electroformed products.

13. An electronic device comprising the probe pin according to claim 8.

14. A plate shaped probe pin, comprising:
an elastic part extending and contracting along a center line;
a first contact disposed on one side of the center line and having a rectangular cross section; and a second contact disposed on another side of the center line and having a rectangular cross section, wherein the first contact and the second contact are supported so as to be reciprocable via the elastic part and are electrically connected to each other, the second contact includes an inclined surface which is inclined along a thickness direction of the probe pin and a width direction orthogonal to the thickness direction, when the second contact is pressed against a plane of an inspection, a tip of the inclined surface in the extending direction comes into contact with the plane, and the first contact includes a peeling groove extending along the thickness direction and respectively formed at both ends of a contact surface in the width direction, the contact surface being an end face of the first contact in the extending direction.

15. The probe pin according to claim 14, comprising:

a coil spring being the elastic part;

a first plunger including a first contact part provided with the first contact; and a second plunger including a second contact part provided with the second contact, wherein the first and second plungers inserted respectively from both ends of the coil spring are coupled to each other so as to be slidable in the coil spring.

16. The probe pin according to claim 15, wherein the first and second plungers are electroformed products.

17. The probe pin according to claim 14, wherein the elastic part is a bellows-shaped elastic body, and the probe pin has a shape in which the first contact part provided with the first contact and the second contact part provided with the second contact are integrally molded so as to be reciprocable mutually via the elastic body.

18. The probe pin according to claim 17, wherein the integral elastic body and the first and second contact parts are electroformed products.

19. An electronic device comprising the probe pin according to claim 14.

* * * * *